(12) United States Patent
Tsai et al.

(10) Patent No.: US 10,739,084 B2
(45) Date of Patent: Aug. 11, 2020

(54) LIQUID COOLING HEAT SINK STRUCTURE AND COOLING CIRCULATION SYSTEM THEREOF

(71) Applicant: COOLER MASTER CO., LTD., New Taipei (TW)

(72) Inventors: Shui-Fa Tsai, New Taipei (TW); Chang-Han Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 208 days.

(21) Appl. No.: 16/054,856

(22) Filed: Aug. 3, 2018

(65) Prior Publication Data

US 2018/0340744 A1 Nov. 29, 2018

Related U.S. Application Data

(63) Continuation-in-part of application No. 14/988,753, filed on Jan. 6, 2016, now Pat. No. 10,410,955.

(30) Foreign Application Priority Data

Jan. 28, 2015 (CN) ..................... 2015 2 0060654 U
Oct. 28, 2015 (CN) ..................... 2015 2 0843219 U

(51) Int. Cl.
*G06F 1/20* (2006.01)
*F28F 3/02* (2006.01)
(Continued)

(52) U.S. Cl.
CPC ................ *F28F 3/02* (2013.01); *F28D 15/00* (2013.01); *H05K 7/20254* (2013.01);
(Continued)

(58) Field of Classification Search
CPC ... G06F 1/20; G06F 2200/201; H01L 23/473; H01L 23/4006; H01L 23/373; H01L 23/3736; H05K 7/20254
(Continued)

(56) References Cited

U.S. PATENT DOCUMENTS 5,052,472 A 10/1991 Takahashi et al.
6,054,676 A 4/2000 Wall et al.
(Continued)

FOREIGN PATENT DOCUMENTS

DE 102011121064 A1 6/2013
JP S61-018159 A 1/1986
(Continued)

OTHER PUBLICATIONS

Non-Final Office Action issued in U.S. Appl. No. 15/433,073, dated Jun. 22, 2018.
(Continued)

*Primary Examiner* — J. Todd Newton
(74) *Attorney, Agent, or Firm* — McDermott Will & Emery LLP

(57) ABSTRACT

A liquid cooling heat sink structure includes a thermal conduction module configured to dissipate heat and including a heat exchange unit; a cover coupled to the thermal conduction module and enclosing the heat exchange unit, the cover and the thermal conduction module defining a heat exchange chamber that includes the heat exchange unit, the cover defining a first opening and a second opening, and the cover being coupled to the thermal conduction module such that at least one of the first and second openings is above the heat exchange unit; a flow guidance plate disposed on the cover; and a housing disposed on the flow guidance plate and defining a first cavity and a second cavity fluidly isolated from each other, wherein the housing includes two fluid (Continued)

inlets each in fluid communication with the first cavity, and a fluid outlet in fluid communication with the second cavity.

16 Claims, 12 Drawing Sheets

(51) Int. Cl.
*F28D 15/00* (2006.01)
*H05K 7/20* (2006.01)
*F28D 21/00* (2006.01)

(52) U.S. Cl.
CPC . *H05K 7/20272* (2013.01); *F28D 2021/0028* (2013.01); *F28F 2250/08* (2013.01)

(58) Field of Classification Search
USPC .......................... 165/80.4; 361/699; 415/176
See application file for complete search history.

(56) References Cited

U.S. PATENT DOCUMENTS

| | | |
|---|---|---|
| 6,167,952 B1 | 1/2001 | Downing |
| 6,966,359 B1 | 11/2005 | Liu |
| 7,007,506 B2 | 3/2006 | Kubo et al. |
| 7,055,581 B1 | 6/2006 | Roy |
| 7,240,722 B2 | 7/2007 | Lai et al. |
| 7,249,625 B2 | 7/2007 | Duan |
| 7,325,591 B2 * | 2/2008 | Duan .................... H01L 23/473 165/104.33 |
| 7,753,662 B2 * | 7/2010 | Lai ...................... F04D 13/0606 165/80.4 |
| 8,051,898 B2 | 11/2011 | Chiang |
| 8,240,362 B2 | 8/2012 | Eriksen |
| 8,245,764 B2 | 8/2012 | Eriksen |
| 8,261,813 B2 | 9/2012 | Oikawa |
| 8,746,330 B2 * | 6/2014 | Lyon ....................... F28D 15/00 165/170 |
| 9,345,169 B1 | 5/2016 | Campbell et al. |
| 9,441,640 B2 | 9/2016 | Park et al. |
| 9,795,058 B2 | 10/2017 | Tsai |
| 2004/0130874 A1 | 7/2004 | Maveety et al. |
| 2005/0241806 A1 | 11/2005 | Liu |
| 2006/0185378 A1 | 8/2006 | Duan et al. |
| 2006/0225867 A1 | 10/2006 | Park et al. |
| 2008/0029260 A1 | 2/2008 | Hu et al. |
| 2009/0101316 A1 | 4/2009 | Han et al. |
| 2009/0159244 A1 * | 6/2009 | Mounioloux ............. G06F 1/20 165/104.33 |
| 2009/0284921 A1 | 11/2009 | Colgan et al. |
| 2012/0152498 A1 * | 6/2012 | Lyon ..................... H01L 23/473 165/104.31 |
| 2012/0175094 A1 | 7/2012 | Rice |
| 2013/0008628 A1 | 1/2013 | Tiengtum et al. |
| 2013/0051108 A1 | 2/2013 | Nagao et al. |
| 2015/0021756 A1 | 1/2015 | Adachi |
| 2016/0309618 A1 | 10/2016 | Tsai et al. |
| 2016/0338223 A1 | 11/2016 | Tsai et al. |
| 2016/0363967 A1 * | 12/2016 | Tsai .................. H05K 7/20272 |
| 2017/0045300 A1 | 2/2017 | Boday et al. |
| 2017/0045306 A1 * | 2/2017 | Tsai ..................... H01L 23/473 |
| 2017/0045307 A1 | 2/2017 | Tsai |
| 2017/0118870 A1 | 4/2017 | Yin et al. |
| 2017/0192471 A1 | 7/2017 | Tsai et al. |
| 2017/0235350 A1 | 8/2017 | Tsai |
| 2018/0139865 A1 * | 5/2018 | Draht ................. H05K 7/20254 |
| 2018/0213677 A1 | 7/2018 | Wu et al. |
| 2018/0259267 A1 | 9/2018 | Tsai et al. |
| 2018/0332734 A1 | 11/2018 | Bandorawalla et al. |
| 2018/0340744 A1 | 11/2018 | Tsai et al. |

FOREIGN PATENT DOCUMENTS

| | | |
|---|---|---|
| KR | 10-0529825 B1 | 11/2005 |
| TW | M278938 U | 10/2005 |
| TW | M311234 U | 5/2007 |

OTHER PUBLICATIONS

Chinese Patent Application No. 201611132425.3 filed Dec. 9, 2016 with English translation.
Chinese Patent Application CN 201511023351.5 filed Dec. 30, 2015 with English translation.
Final Office Action issued in U.S. Appl. No. 14/988,753, dated Jan. 11, 2019.
Non-Final Office Action issued in U.S. Appl. No. 14/988,753, dated Aug. 8, 2018.
Final Office Action issued in U.S. Appl. No. 14/988,753, dated Jan. 16, 2018.
Non-Final Office Action issued in U.S. Appl. No. 14/988,753, dated Jul. 31, 2017.
Non-Final Office Action issued in U.S. Appl. No. 15/395,954, dated Feb. 15, 2019.
Final Office Action issued in U.S. Appl. No. 15/433,073, dated Nov. 13, 2018.

* cited by examiner

LIQUID COOLING HEAT SINK STRUCTURE AND COOLING CIRCULATION SYSTEM THEREOF

CROSS-REFERENCE TO RELATED APPLICATIONS

This non-provisional application is a continuation-in-part of and claims priority under 35 U.S.C. § 120 to U.S. patent application Ser. No. 14/988,753 filed Jan. 6, 2016, which claims priority under 35 U.S.C. § 119 to Chinese patent application nos. 201520843219.8 filed Oct. 28, 2015, and 201520060654.3 filed Jan. 28, 2015, in the State Intellectual Property Office (SIPO) of the People's Republic of China (PRC), the entire contents of all these applications are incorporated herein by reference in their entirety.

FIELD

The technical field relates to heat dissipating systems, more particularly to a liquid cooling heat sink structure and its cooling circulation system.

BACKGROUND

As the processing speed and performance of a central processing unit (CPU) of a computer are enhanced, the heat dissipation problem becomes increasingly more serious, and thus a liquid cooling heat sink structure and its cooling circulation system are introduced.

In general, a conventional cooling circulation system comprises a heat sink structure attached onto a surface of a heat source, a water-cooled exhaust for supplying a cooling liquid to dissipate heat, and a connecting pipeline for connecting the aforementioned components and circulating the cooling liquid in the connecting pipeline. When the cooling liquid passes through the interior of the heat sink structure, the heat absorbed by the heat sink structure is carried away quickly to achieve the cooling and heat dissipating effects, so as to overcome the current problem of having high heat generated by the heat source.

However, the configuration of the aforementioned components is limited by the preset pipeline port positions, so that the installation position of each component is also limited and cannot be readily adjusted.

In view of the aforementioned drawbacks of the prior art, the inventors of this disclosure conducted extensive research and experiments, and finally provided a feasible and effective solution to overcome the drawbacks of the prior art.

SUMMARY

Various aspects of the present disclosure provide a liquid cooling heat sink structure and a cooling circulation system including the liquid cooling heat sink structure.

According to one aspect of the present disclosure, the liquid cooling heat sink structure includes a thermal conduction module configured to dissipate heat and includes a heat exchange unit and a cover coupled to the thermal conduction module and enclosing the heat exchange unit. The cover and the thermal conduction module define a heat exchange chamber that includes the heat exchange unit, the cover defines a first opening and a second opening, and the cover is coupled to the thermal conduction module such that at least one of the first and second openings is above the heat exchange unit. The liquid cooling heat sink structure further includes a flow guidance plate disposed on the cover, and a housing disposed on the flow guidance plate and defining a first cavity and a second cavity fluidly isolated from each other. The housing includes two fluid inlets each in fluid communication with the first cavity, and a fluid outlet in fluid communication with the second cavity.

According to another aspect of the present disclosure, the cooling circulation system includes an exhaust and at least two liquid cooling heat sink structures. The at least two liquid cooling heat sink structures are fluidly coupled to each other in series via a pipeline fluidly coupled to both fluid inlets of each liquid cooling heat sink structure.

According to yet another aspect of the present disclosure, the cooling circulation system includes an exhaust, and at least two liquid cooling heat sink structures. The at least two liquid cooling heat sink structures are fluidly coupled to each other in parallel via a pipeline fluidly coupled to both inlets of each liquid cooling heat sink structure.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

The technical contents of this disclosure will become apparent with the detailed description of preferred embodiments accompanied with the illustration of related drawings as follows. It is intended that the embodiments and figures disclosed herein are to be considered illustrative rather than restrictive.

Figure 1:
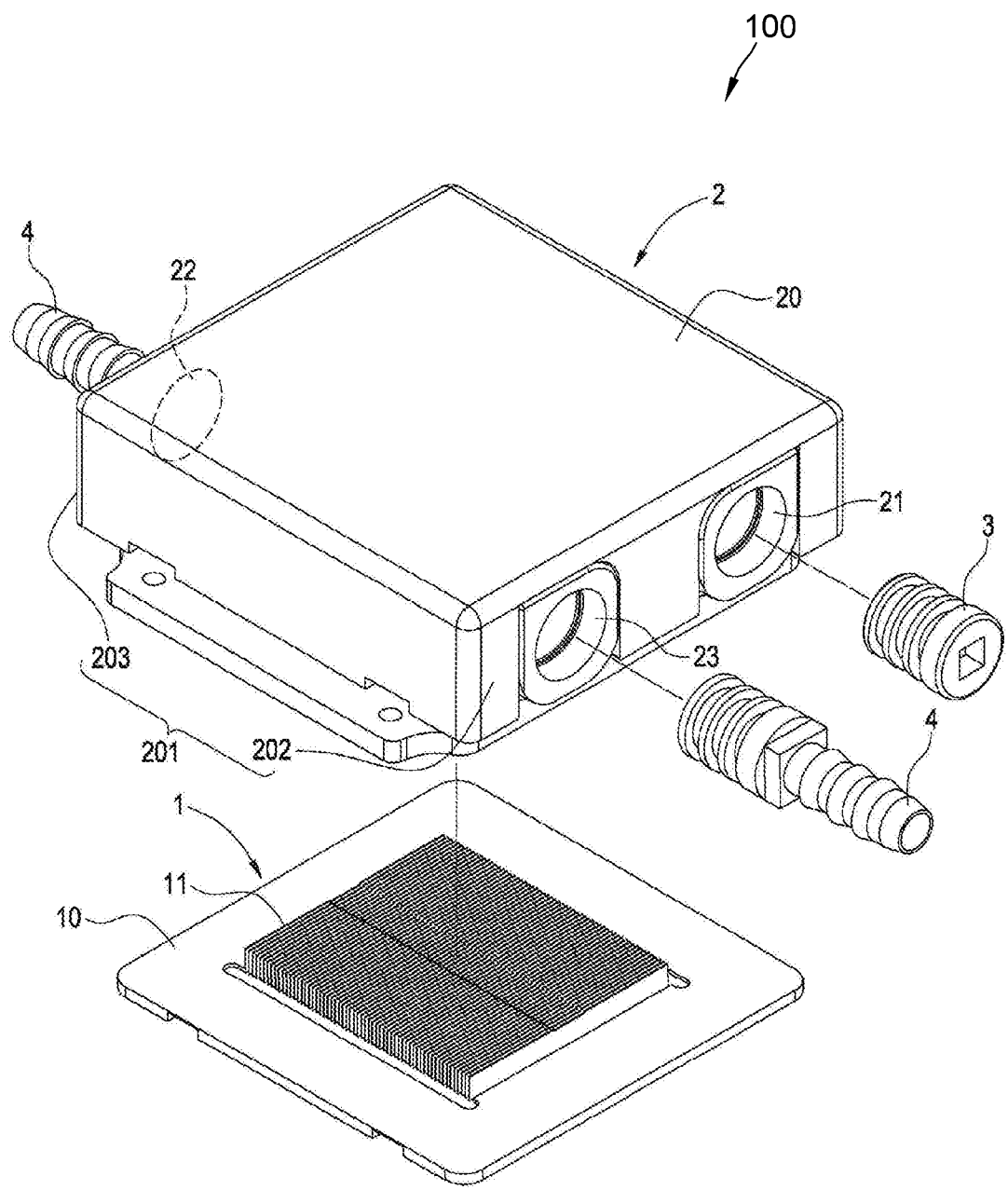
FIG. 1 is an exploded view of a liquid cooling heat sink structure of this disclosure.
Figure 2:
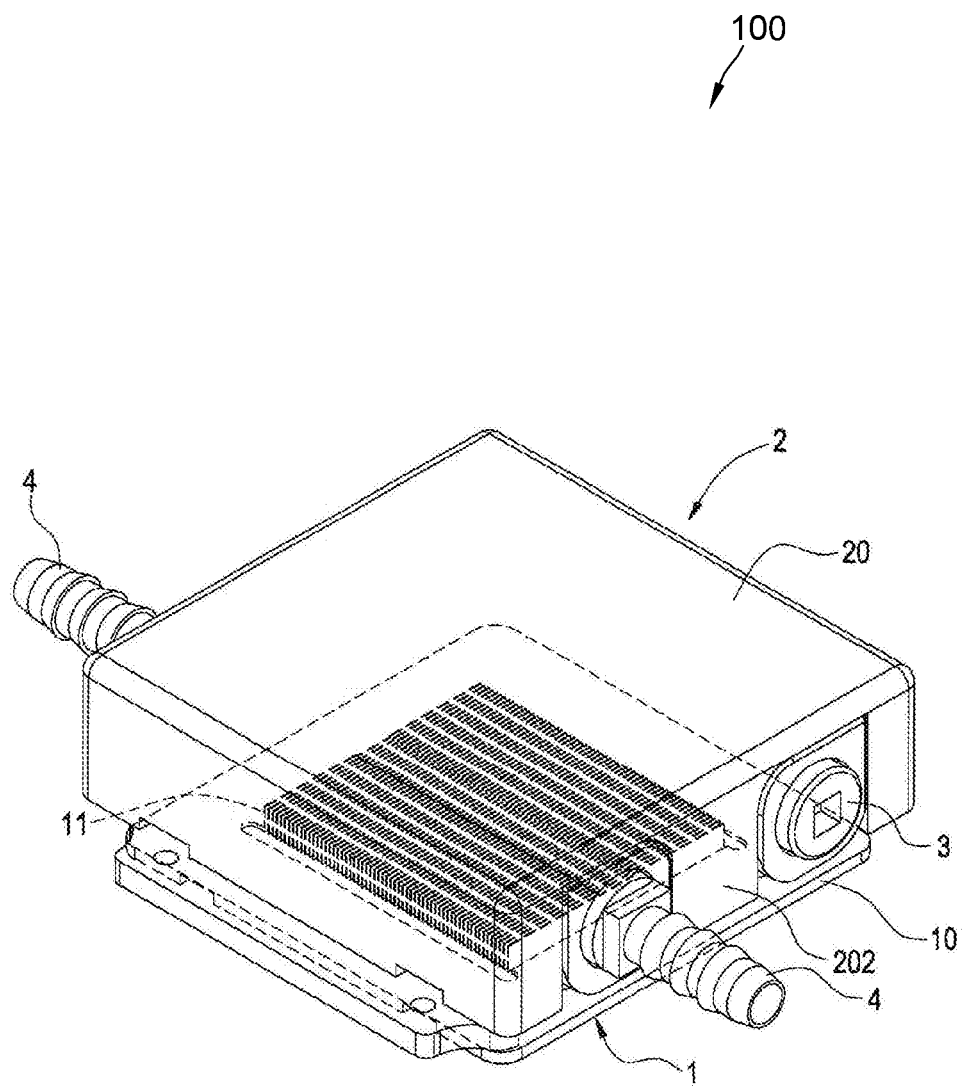
FIG. 2 is a perspective view of a liquid cooling heat sink structure of this disclosure.

With reference to FIGS. 1 and 2 for an exploded view and a perspective view of a liquid cooling heat sink structure 100 and its cooling circulation system of this disclosure respectively, the cooling circulation system comprises one or more liquid cooling heat sink structures 100, and the liquid cooling heat sink structure 100 provided for passing through a cooling liquid (not shown in the figure) comprises a thermal conduction module 1, and a liquid supply module 2.

Figure 4:
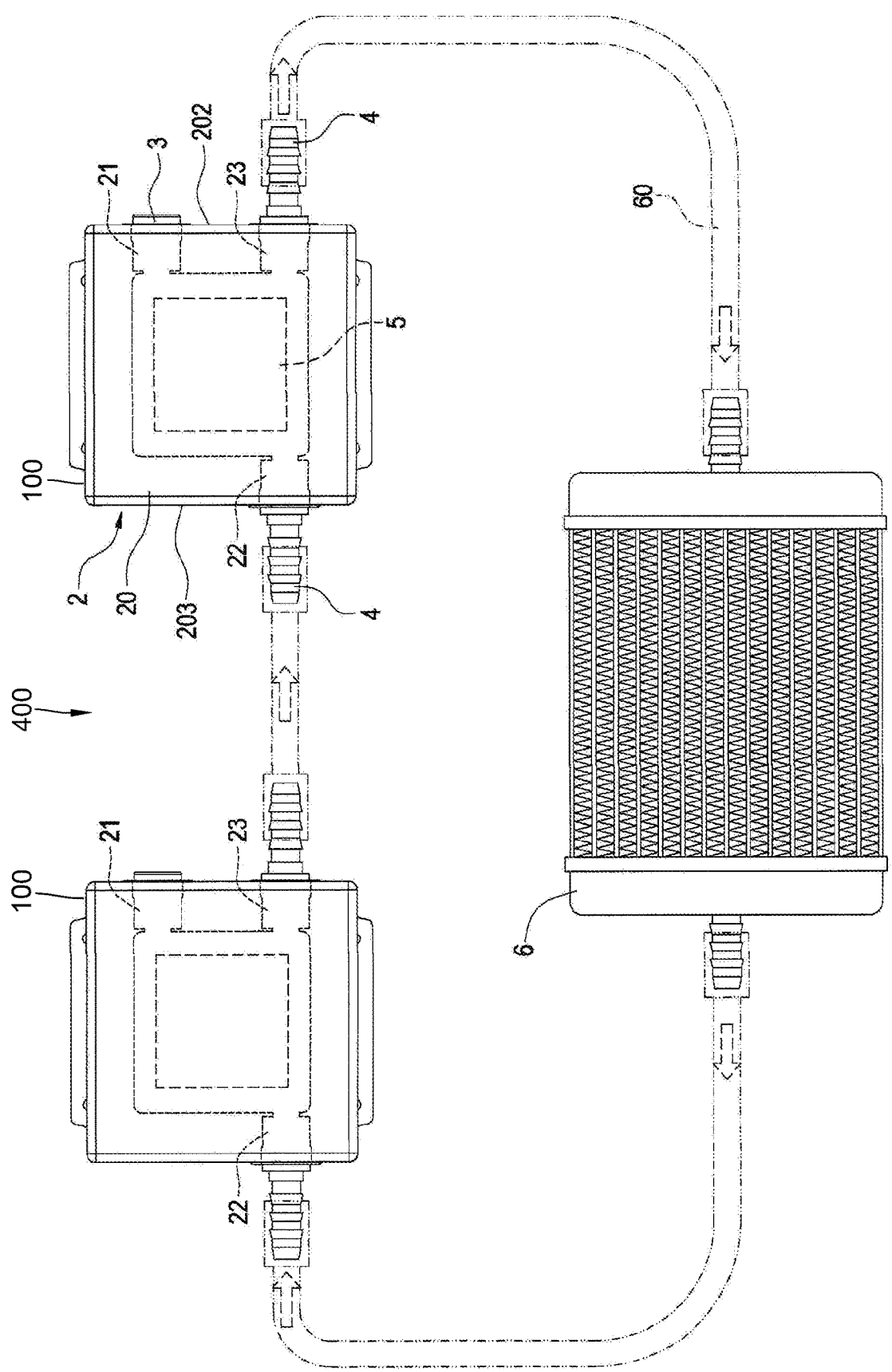
FIG. 4 is a schematic view of a cooling circulation system in accordance with a first preferred embodiment of this disclosure.
Figure 5:
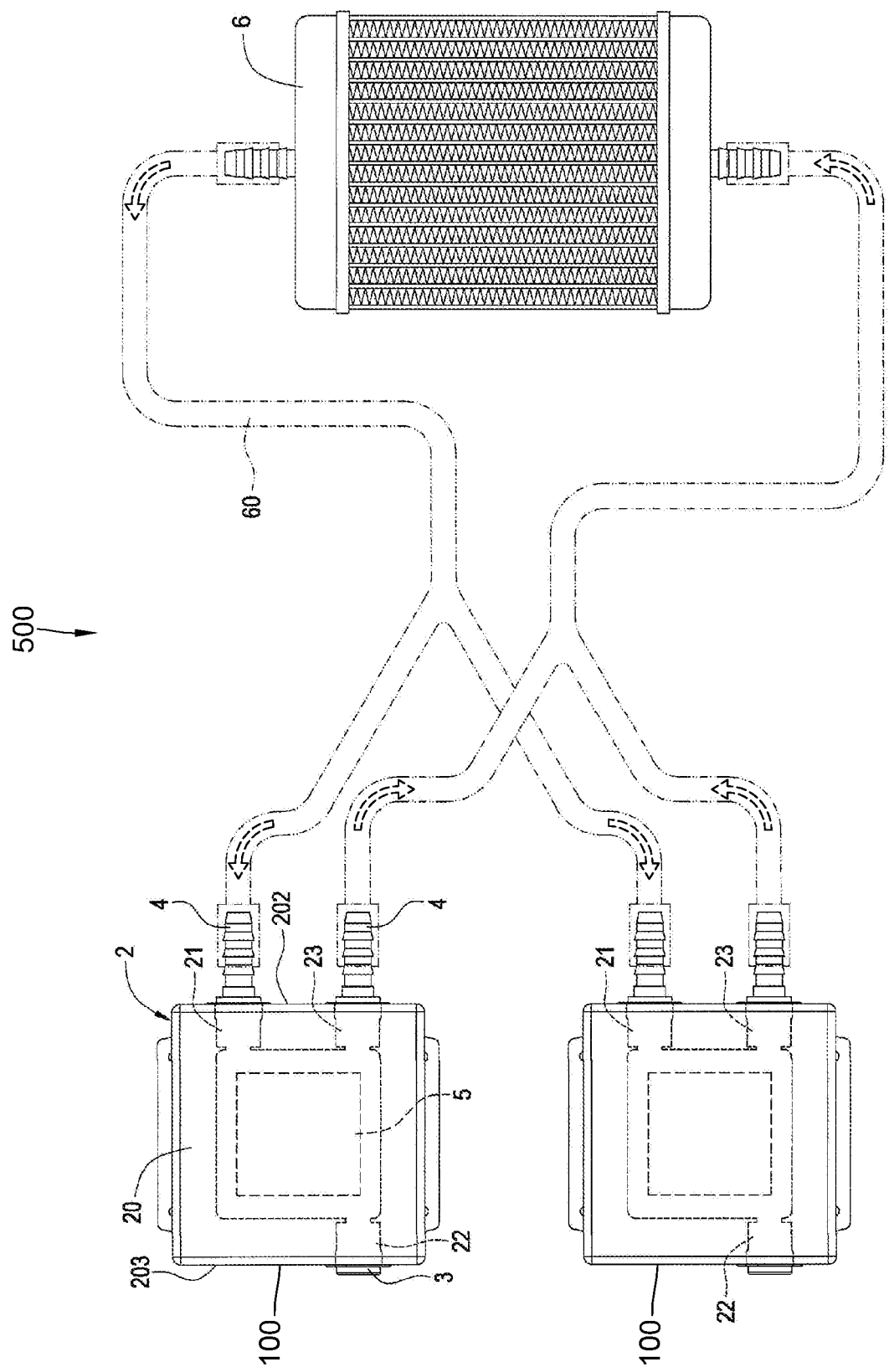
FIG. 5 is a schematic view of a cooling circulation system in accordance with a second preferred embodiment of this disclosure.

The thermal conduction module 1 comprises a thermal conductive substrate 10, and a plurality of fins 11 installed on the thermal conductive substrate 10. The bottom of the thermal conductive substrate 10 is provided for contacting a heat source 5 (as shown in FIG. 4 or 5), and the heat source 5 may be a central processing unit (CPU), a graphic processing unit (GPU), or any other heat generating electronic component or chip, and the thermal conductive substrate 10 conducts the heat to the fins 11 for heat dissipation or cooling.

Figure 3:
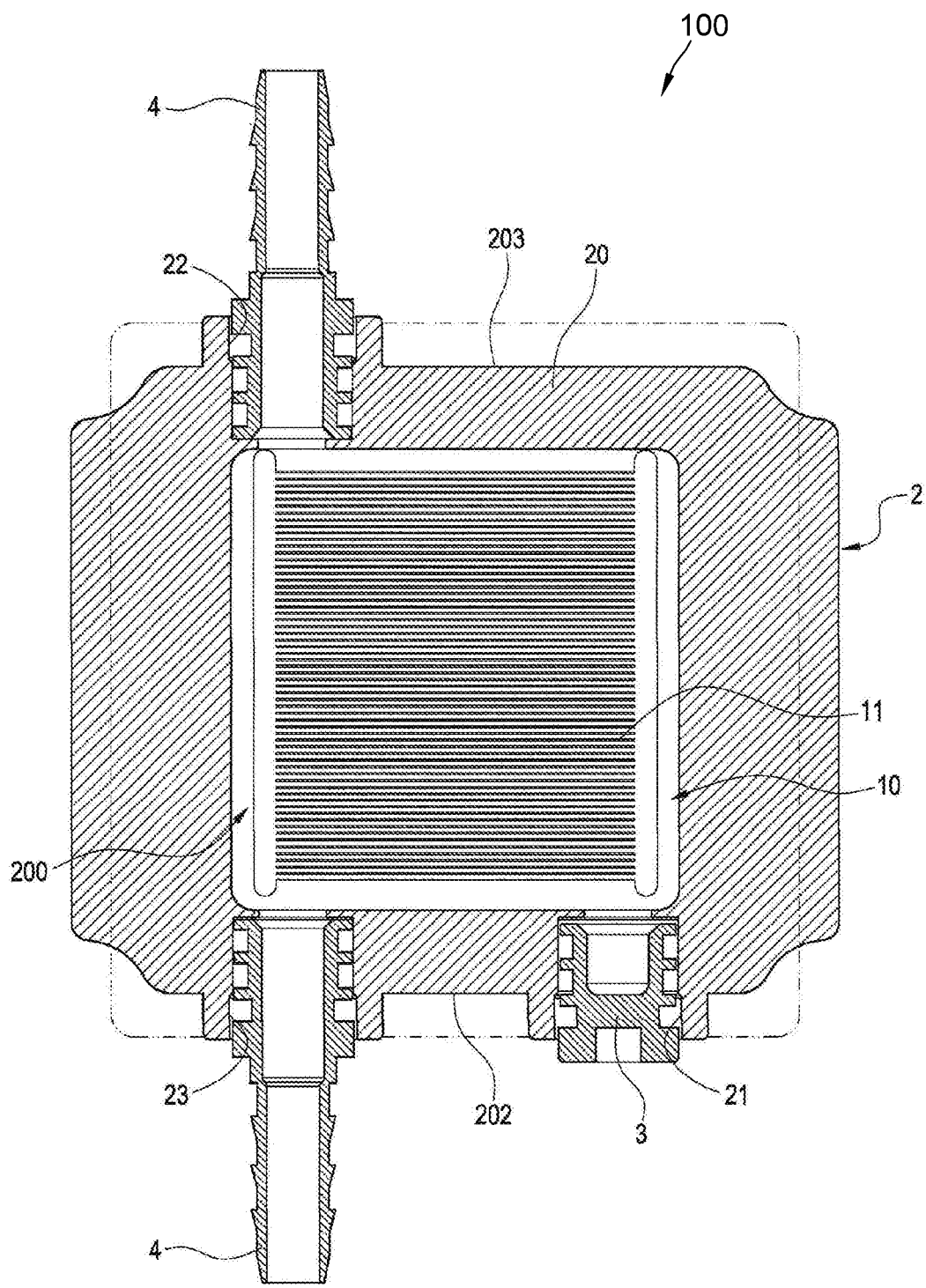
FIG. 3 is a cross-sectional view of a liquid cooling heat sink structure of this disclosure.

The liquid supply module 2 is installed on the thermal conductive substrate 10. With reference to FIG. 3 for a preferred embodiment of this disclosure, the liquid supply module 2 includes a casing 20 having a containing space 200 formed therein. When the casing 20 is installed on the thermal conductive substrate 10, the fins 11 of the thermal conduction module 1 are situated in the containing space 200 and provided for entering the cooling liquid into the containing space 200, and the fins 11 are provided for carrying the heat absorbed by the cooling liquid, so as to achieve a good cooling effect by using the cooling liquid.

With reference to FIGS. 1, 2 and 3 for a liquid cooling heat sink structure 100 of this disclosure, the casing 20 is formed by a continuous peripheral wall 201 that is oriented in directions facing towards the outside of liquid supply module 2. More specifically, in an embodiment, the peripheral wall 201 has a rectangular shape which corresponds to the shape of the casing 20 and at least has a first wall 202 and a second wall 203, and the first and second walls 202 are opposite to each other and oriented in different directions facing the outside of the liquid supply module 2. In the meantime, the peripheral wall 201 has at least two first liquid openings 21, 22, and a second liquid opening 23, and the first liquid openings 21, 22 and the second liquid opening 23 are communicated with the containing space 200 of the casing 20, and the first liquid openings 21, 22 are disposed at positions on any two different facing surfaces of the peripheral wall 201. In an embodiment, the two first liquid openings 21, 22 are disposed on the first wall 202 and the second wall 203 respectively. Since the first and second walls 202, 203 are opposite to each other, therefore they are configured in different directions facing the liquid supply module 2. In other words, the two first liquid openings 21, 22 formed on the first and second walls 202, 203 respectively, are naturally disposed at positions on different facing surfaces.

This disclosure further comprises a plug member 3 selectively installed on any first liquid openings 21, 22 to seal the first liquid opening 21 or 22. Therefore, the heat sink structure may be used according to the connecting position of the pipeline, and the liquid openings 21, 22 or 23 may be used as liquid inlets or outlets (such as the two first liquid openings 21, 22 being liquid inlets, and the second liquid opening 23 being a liquid outlet; or the two first liquid openings 21, 22 being liquid outlets, and the second liquid opening 23 being a liquid inlet), and one of the two first liquid openings 21, 22 is selected for use, and the other first liquid openings 21, 22 is sealed by the plug member 3, so as to provide the effect of configuring the heat sink structure more flexibly.

By the aforementioned components, the liquid cooling heat sink structure of this disclosure is formed.

In addition, this disclosure further provides a cooling circulation system 400. With reference to FIG. 4 for a cooling circulation system 400 in accordance with the first preferred embodiment of this disclosure, the cooling circulation system 400 comprises at least two liquid cooling heat sink structures 100, and a water-cooled exhaust 6, and the two liquid cooling heat sink structures 100 and the water-cooled exhaust 6 are connected in series. Wherein, any one of the first liquid opening 21 of the two liquid cooling heat sink structures 100 is sealed by the plug member 3, and the other first liquid opening 22 and the second liquid opening 23 are connected by a pipe connector 4, so that the connecting pipeline 60 connects the two liquid cooling heat sink structures 100 and the water-cooled exhaust 6 in series. Now, the second liquid opening 23 and the other first liquid opening 22 connected to the pipe connector 4 are disposed on different facing surfaces (or situated on the first wall 202 and the second wall 203 of the peripheral wall 201 respectively; in other words, the first liquid opening 21 connected to the plug member 3 and the second liquid opening 23 are disposed at positions of different facing surfaces respectively).

With reference to FIG. 5 for a cooling circulation system 500 in accordance with the second preferred embodiment of this disclosure, the cooling circulation system 500 is connected to the two liquid cooling heat sink structures 100 and the water-cooled exhaust 6 in parallel. Wherein, any one of the first liquid openings 22 of the two liquid cooling heat sink structures 100 is sealed by the plug member 3 and the other first liquid opening 21 and the second liquid opening 23 are connected by a pipe connector 4, so that the connecting pipeline 60 connects the two liquid cooling heat sink structures 100 and the water-cooled exhaust 6 in parallel. Now, the second liquid opening 23 and the first liquid opening 21 connected with the pipe connector 4 are disposed on the same surface (or the first wall 202 of the peripheral wall 201).

By the aforementioned components, the cooling circulation systems 400 and 500 of this disclosure are formed.

In summation of the description above, the liquid cooling heat sink structure 100 and its cooling circulation systems 400 and 500 in accordance with this disclosure are novel and inventive and comply with patent application requirements.

Figure 6:
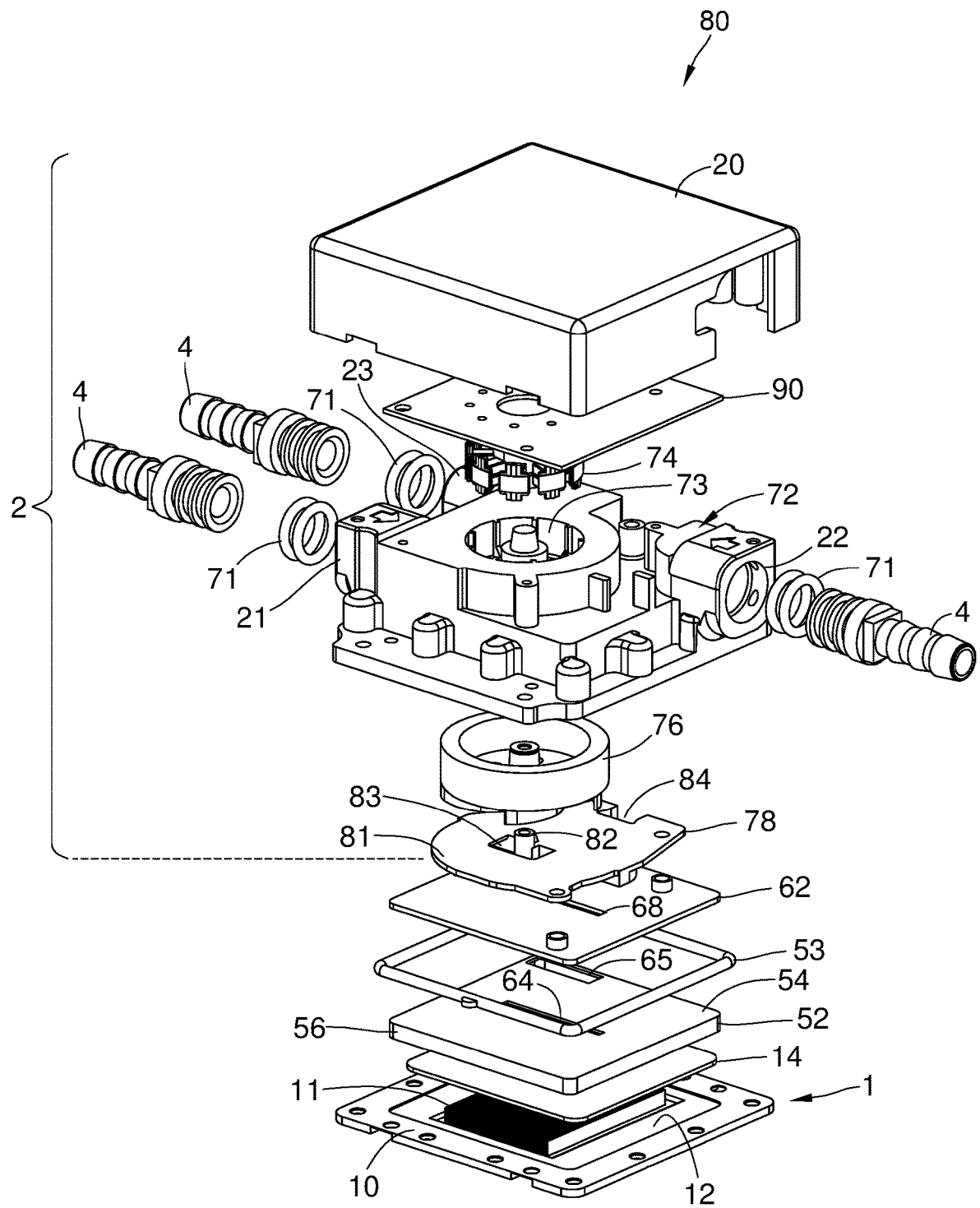
FIG. 6 is an exploded view of a liquid cooling heat sink structure, according to disclosed embodiments.
Figure 7A:
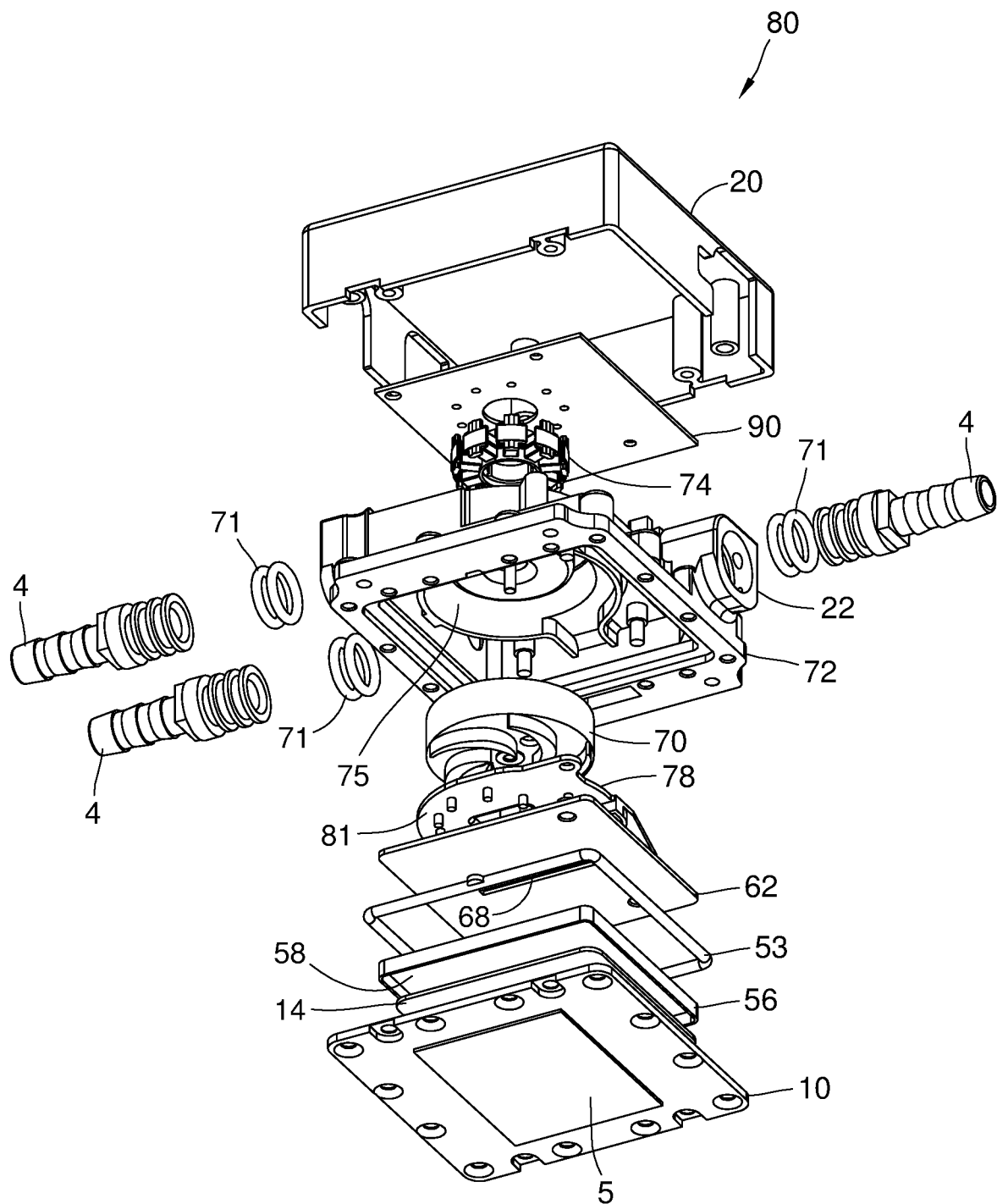
FIG. 7A is another exploded view of the liquid cooling heat sink structure of FIG. 6, according to disclosed embodiments.

FIG. 6 is a top exploded view of a liquid cooling heat sink structure 80, according to disclosed embodiments. FIG. 7A is a bottom exploded view of the liquid cooling heat sink structure 80, according to disclosed embodiments. The liquid cooling heat sink structure 80 may be similar in some respects to the liquid cooling heat sink structure 100 in FIGS. 1-3, and therefore may be best understood with reference thereto where like numerals designate like components not described again in detail.

Referring to FIGS. 6 and 7A, a cover 52 is disposed on the thermal conduction module 1. The cover 52 is formed from a top plate 54 and a sidewall 56 disposed along the entire peripheral edge of the top plate 54. The top plate 54 and the sidewall 56 together define a cavity 58 that is sized or otherwise configured to receive heat exchange unit, for example, the plurality of fins 11 (or pins, columns, or any other structure of a desired shape and size for dissipating heat). When disposed on the thermal conductive substrate 10, the top plate 54, the sidewall 56, and the thermal conductive substrate 10 cooperatively define a heat exchange chamber. The top plate 54 defines a first opening 64 and a second opening 65. The first and second openings 64 and 65 may be shaped as elongated slots extending parallel to each other in the top plate 54. As illustrated, the first opening 64 may be longer than the second opening 65. However, the first and second openings 64 and 65 are not limited to elongated slots, and the first and second openings 64 and 65 may be square, circular, polygonal, or of any desired shape, and may have any desired size, without departing from the scope of the disclosure. The cover 52 (or at least a portion thereof) may include a non-metal material such as plastic.

The thermal conductive substrate 10 defines a recess (or depression) 12 about the fins 11 and in fluid communication with the fins 11. A pad 14 is positioned in the recess 12. The pad 14 includes a through hole that is sized and shaped to receive the fins 11 when the pad 14 positioned in the recess 12. The pad 14 includes a notch (or similar) on a peripheral edge thereof and that is sized and shaped to prevent occluding the fluid flow between the second opening 65 and the heat exchange chamber.

When the cover 52 is positioned on the thermal conductive substrate 10, all the fins 11 are received in the cavity 58. The cover 52 may be welded to the thermal conductive substrate 10 to secure the cover 52 to the thermal conductive substrate 10. The welding is not limited to any specific type of welding and the cover 52 may be welded to the thermal conductive substrate 10 using any suitable type of welding, without departing from the scope of the disclosure. Other fastening techniques, such as riveting, screwing, press-fitting, and the like, fasteners, such as rivets, screws, nuts, bolts, etc., may be used to secure the cover 52 to the thermal conductive substrate 10.

The cover 52 may be positioned on the thermal conductive substrate 10 such that at least one of the first and second openings 64 and 65 is positioned over the fins 11. The cover 52 may be positioned such that the fins 11 extend in a direction perpendicular to the direction in which the first opening 64 and the second opening 65 extend. Stated otherwise, the fins 11 extend in a direction from the first opening 64 to the second opening 65. The thermal conductive substrate 10 is attached to the heat source 5, which may be an electronic component (e.g., a central processing unit (CPU)) from which heat is to be dissipated. Specifically, and as illustrated in FIG. 7A, the heat source 5 is attached to the bottom surface (e.g., the surface of the thermal conductive substrate 10 opposite to the surface having the fins 11) using a thermally conductive material (e.g., thermal grease) in order to transfer the heat generated from the heat source 5 to the thermal conductive substrate 10.

During operation, a fluid having a relatively lower temperature is circulated into the heat exchange chamber. The fluid enters the heat exchange chamber via the first opening 64 and flows along the fins 11. While flowing, the heat generated by the heat source 5 is transferred to the fluid via the thermal conductive substrate 10 and the fins 11, and the temperature of the fluid increases. The fluid having the increased temperature exits the heat exchange chamber via the second opening 65.

The vertical extent of the thermal conductive substrate 10 from the thermal conductive substrate 10 is such that the top edge of the fins 11 may contact (or be in close proximity with) the cover 52. Thus, the fluid (or at least a major portion thereof) entering the heat exchange chamber flows along the fins 11 and, as a result, the heat exchange efficiency between the fins 11 and the thermal conductive substrate 10 is increased. Furthermore, the width of the first opening 64 is substantially equal to an extent of the fins 11 on the thermal conductive substrate 10, and this causes the low-temperature fluid to flow along each fin and, thereby increase the heat exchange efficiency. In addition, the difference in the lengths of the first and second openings 64, 65 causes the fluid to remain in the heat exchange chamber for relatively longer time duration, and, further increase the heat exchange efficiency. Still further, the elongated shape of the first opening 64 reduces the passage area for the fluid entering the heat exchange chamber and thus the flow velocity of the fluid is increased. The increased flow velocity further increases the heat exchange efficiency.

A separating plate 62 is arranged over the cover 52. The separating plate 62 includes two through openings (one through opening 68 shown) corresponding to the first and second openings 64, 65 in size and shape. Each of the two through openings is located directly above the corresponding first and second openings 64, 65 and is in fluid communication with the corresponding first and second openings 64, 65. A sealing element 53 (e.g., a washer or the like) may be disposed along the peripheral edge of the separating plate 62 and between the separating plate 62 and the cover 52 to prevent fluid flowing between the heat exchange chamber and the liquid supply module 2 from leaking. The separating plate 62 includes a thermally resistive material.

The liquid supply module 2 includes the casing 20, a housing 72 that is received in the casing 20, a stator 74 and a rotor 76 each received in the housing 72, and a flow guidance plate 78 coupled to the housing 72. The housing 72 defines a first cavity 73 that is sized or otherwise configured to receive the stator 74 therein. The housing 72 includes fluid inlets 21, 22 and a fluid outlet 23 of the liquid cooling heat sink structure 80. Pipe connectors 4 are coupled to the fluid inlets 21, 22 and the fluid outlet 23 via sealing elements 71. Although, the liquid cooling heat sink structure 80 includes two fluid inlets 21, 22 and a single fluid outlet 23, the fluid inlets and fluid outlet are not limited in this regard. In another embodiment, the liquid cooling heat sink structure 80 may include a single fluid inlet and two fluid outlets.

Figure 7B:
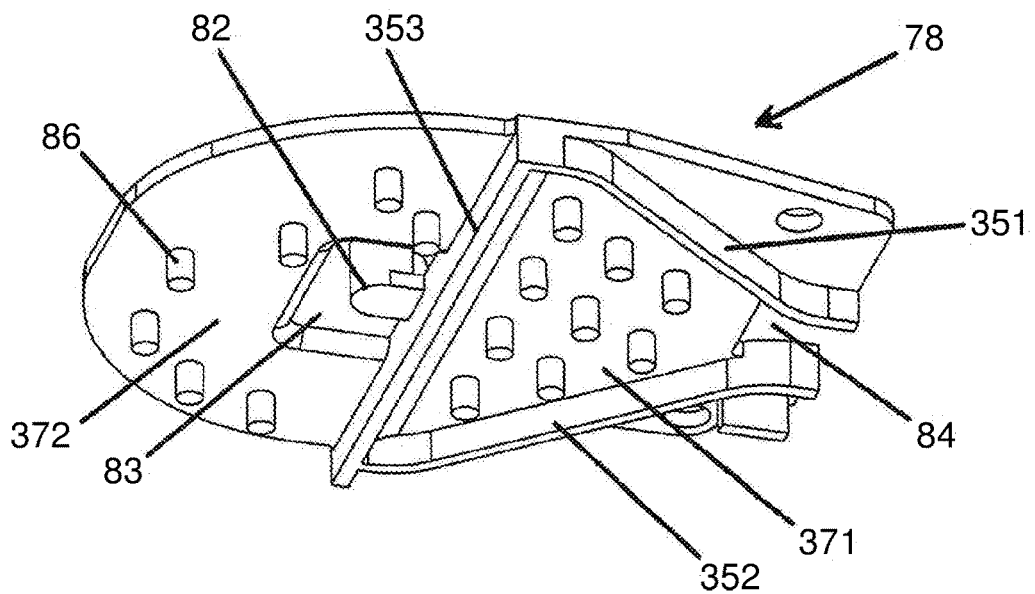
FIGS. 7B and 7C illustrate bottom perspective views of the flow guidance plate in FIGS. 6 and 7A, according to embodiments disclosed.
Figure 7C:
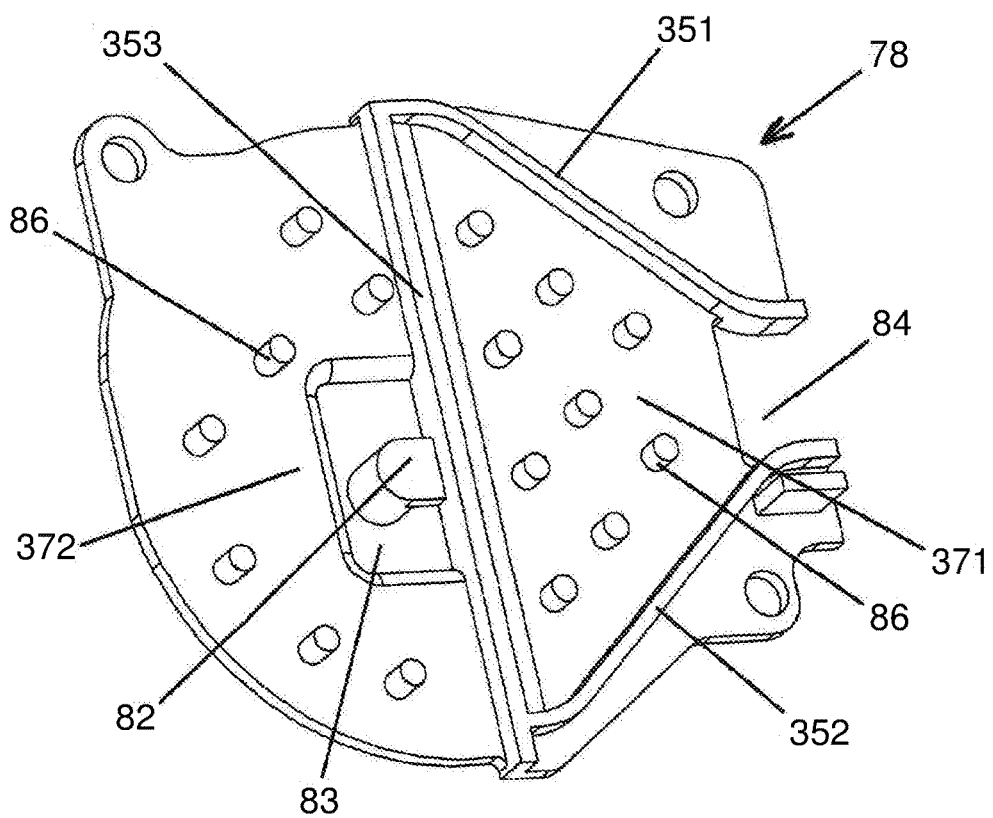

The flow guidance plate 78 includes a body 81 defining a first plate opening 83 and a second plate opening 84. A first guide sleeve 82 is disposed in the first plate opening 83. FIGS. 7B and 7C illustrate bottom perspective views of the flow guidance plate 78, according to embodiments disclosed. As illustrated, the bottom surface of the body 81 includes two sidewalls 351, 352, and an end of each sidewall 351, 352 extending generally longitudinally from the second plate opening 84 to an end wall 353 that extends transversely across the flow guidance plate 78. The end wall 353 and the sidewalls 351, 352 together form a first cavity 371. The first cavity 371 is in fluid communication with the second plate opening 84. The end wall 353 defines the first cavity 371 on one side thereof and a second cavity 372 on an opposite side thereof. The end wall 353 is disposed adjacent the first plate opening 83. The bottom surface of the flow guidance plate 78 includes a plurality of columns 86 (FIG. 7B) formed thereon and disposed uniformly in the first cavity 371 and the second cavity 372. The columns 86 contact the top plate 54 and provide support to the flow guidance plate 78.

Figure 7D:
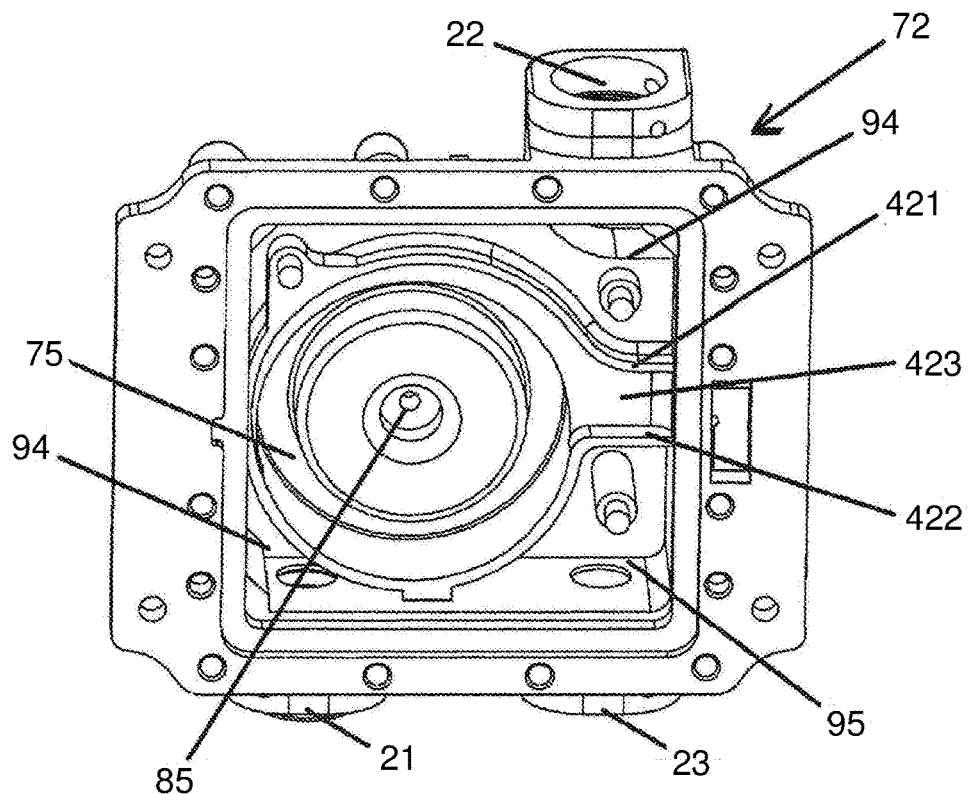
FIG. 7D is a bottom perspective view of the housing in FIGS. 6 and 7A, according to embodiments disclosed.

FIG. 7D is a bottom perspective view of the housing 72, according to embodiments disclosed. Referring to FIG. 7B, with continued reference to FIGS. 6 and 7A, the bottom of the housing 72 defines a second cavity 75 that is sized or otherwise configured to receive the rotor 76. The second cavity 75 at least partially defines the pumping chamber of the liquid cooling heat sink structure 80. The first cavity 73 and the second cavity 75 are fluidly isolated from each other in order to prevent the fluid from entering the first cavity 73, and reaching the stator 74 and any associated circuitry (e.g., printed circuit board 90).

Figure 7E:
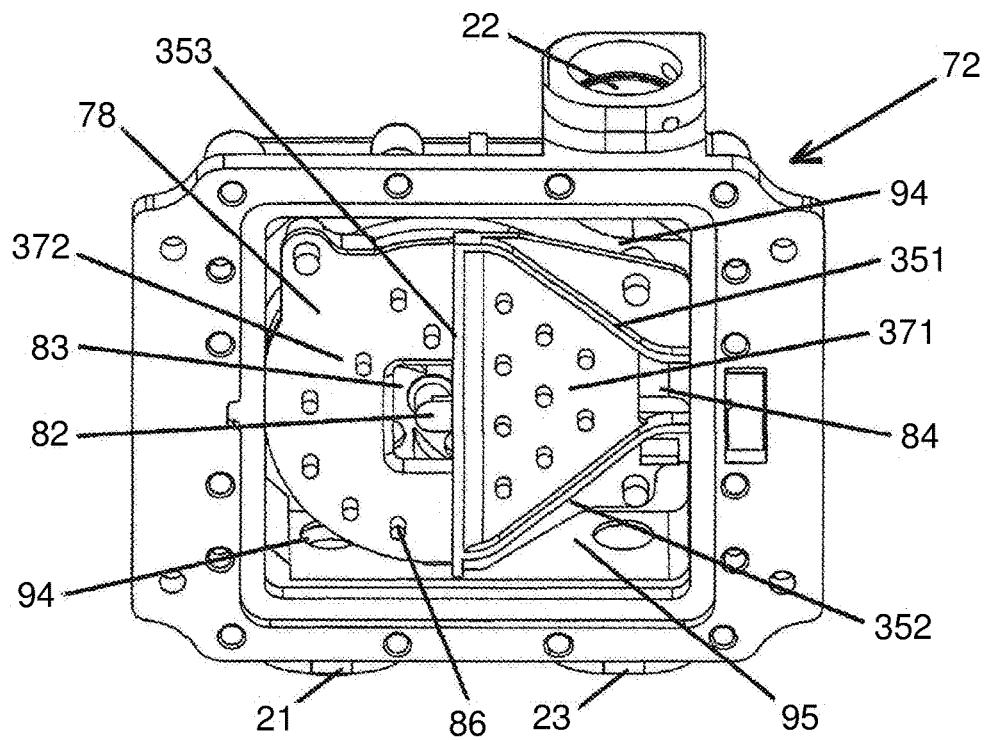
FIG. 7E illustrates a bottom perspective view of the housing in FIGS. 6 and 7A with the flow guidance plate in FIGS. 6 and 7A coupled thereto, according to embodiments disclosed.

FIG. 7E illustrates a bottom perspective view of the housing 72 with the flow guidance plate 78 coupled thereto, according to embodiments disclosed. Referring to FIG. 7E, with continued reference to FIGS. 6, 7A, and 7D, the flow guidance plate 78 is positioned underneath the second cavity 75, and seals the second cavity 75. The second cavity 75 is defined by extension portions 421, 422. The extension portions 421, 422 also define a channel 423 that is in fluid communication with the second plate opening 84 of the first cavity 371 when the housing 72 is positioned on the flow guidance plate 78. The first cavity 371 is in fluid communication with the channel 423 via the second plate opening 84, and the second cavity 372 is in fluid communication with the second cavity 75 of the housing 72 via the first plate opening 83. A central portion of the second cavity 75 includes a second guide sleeve 85 that may align with the first guide sleeve 82 of the flow guidance plate 78 when the flow guidance plate 78 is positioned in the housing 72. The second guide sleeve 85 is sized or otherwise configured to receive a rotating axle of the rotor 76.

The extension portions 421, 422 and the housing 72 at least partially define a third cavity 94 and a fourth cavity 95 therebetween. The third cavity 94 and the fourth cavity 95 are separated from each other. When the housing 72 is positioned on the flow guidance plate 78, the fourth cavity 95 is located on a lower right corner on the bottom of the housing 72. The third cavity 94 is divided into two parts that are arranged diagonally from each other. Specifically, one portion of the third cavity 94 is arranged on a top right corner and opposite the fourth cavity 95 on the bottom of the housing 72, and a second portion of the third cavity 94 is arranged at a lower left corner of the housing 72. The two portions of the third cavity 94 are in fluid communication with each other via the unbounded portion of the second cavity 372. When the flow guidance plate 78 is positioned in the housing 72, the fourth cavity 95 is in fluid communication with the second opening 65 of the cover 52.

The fluid inlets 21, 22 are in fluid communication with the third cavity 94 and the fluid outlet 23 is in fluid communication with the fourth cavity 95. As discussed below, when the liquid cooling heat sink structure 80 is connected to an external heat dissipating device, e.g., exhaust 6 (FIGS. 4 and 5) for circulating a cooling fluid between the liquid cooling heat sink structure 80 and the external heat dissipating device, the inlets 21 and 22 of the housing 72 are connected to an outlet of the external heat dissipating device, and the outlet 23 is connected to an inlet of the external heat dissipating device.

Returning to FIGS. 6 and 7A, when the liquid cooling heat sink structure 80 is assembled, the flow guidance plate 78 is positioned on the separating plate 62 and the separating plate 62 is positioned on the top plate 54. The opening 68 in the separating plate 62 and the first opening 64 of the cover 52 are located on a side of the end wall 353 including the first cavity 371. The openings 64, 68 and the first cavity 371 are in fluid communication with each other. The first cavity 371 is defined by the top plate 54 of the cover 52, the flow guidance plate 78, the end wall 353, and the sidewalls 351, 352. The only two openings in fluid communication with the first cavity 371 are the openings 64 and 68 of the cover 52 and the second plate opening 84 of the flow guidance plate 78. The second cavity 372 is defined by the body 81 of the flow guidance plate 78 on the top and the top plate 54 of the cover 52 on the bottom. The end wall 353 bounds one side of the second cavity 372 and the remaining three sides of the second cavity 372 are unbounded. The first plate opening 83 of the flow guidance plate 78 is located on a side of the end wall 353 opposite the first cavity 371 and is in fluid communication with the second cavity 372.

Because the second cavity 75 is sealed by the flow guidance plate 78, fluid volume loss may be minimized and delivery efficiency can be increased during the operation of the rotor 76 positioned in the second cavity 75. A printed circuit board 90 including the circuitry for controlling an operation of the motor including the stator 74 and rotor 76 is disposed on the housing 72 and in the casing 20.

During operation of the liquid cooling heat sink structure 80, according to embodiments disclosed, the operation of the rotor 76 causes the cooling fluid from the exhaust 6 to enter into the third cavity 94 via the inlet 21 and/or the inlet 22. As mentioned above, the outer perimeter of the second cavity 372 is unbounded, and the cooling fluid inside the third cavity 94 flows through the unbounded space into the second cavity 372.

The second cavity 372 is in fluid communication with the second cavity 75 via the first plate opening 83 and the cooling fluid flows into the second cavity 75. The rotor 76 inside the second cavity 75 drives or otherwise imparts motion to the cooling fluid entering the second cavity 75. The cooling fluid then flows into the first cavity 371 via the channel 423 and the second plate opening 84. The cooler fluid then flows into the heat exchange chamber from the first cavity 371 via the first opening 64.

Inside the heat exchange chamber, the heat from the thermal conductive substrate 10 and the fins 11 is transferred to the cooling fluid and the temperature of the cooling fluid increases. The heated fluid flows from the heat exchange chamber into the fourth cavity 95 via the second opening 65 in the cover 52. The heated fluid is then output from the outlet 23 of the housing 72 and flows to the exhaust 6. The heated fluid is cooled in the exhaust 6, and the cooler fluid is then recirculated to the inlet 21 and/or inlet 22 of the housing 72.

Figure 8:
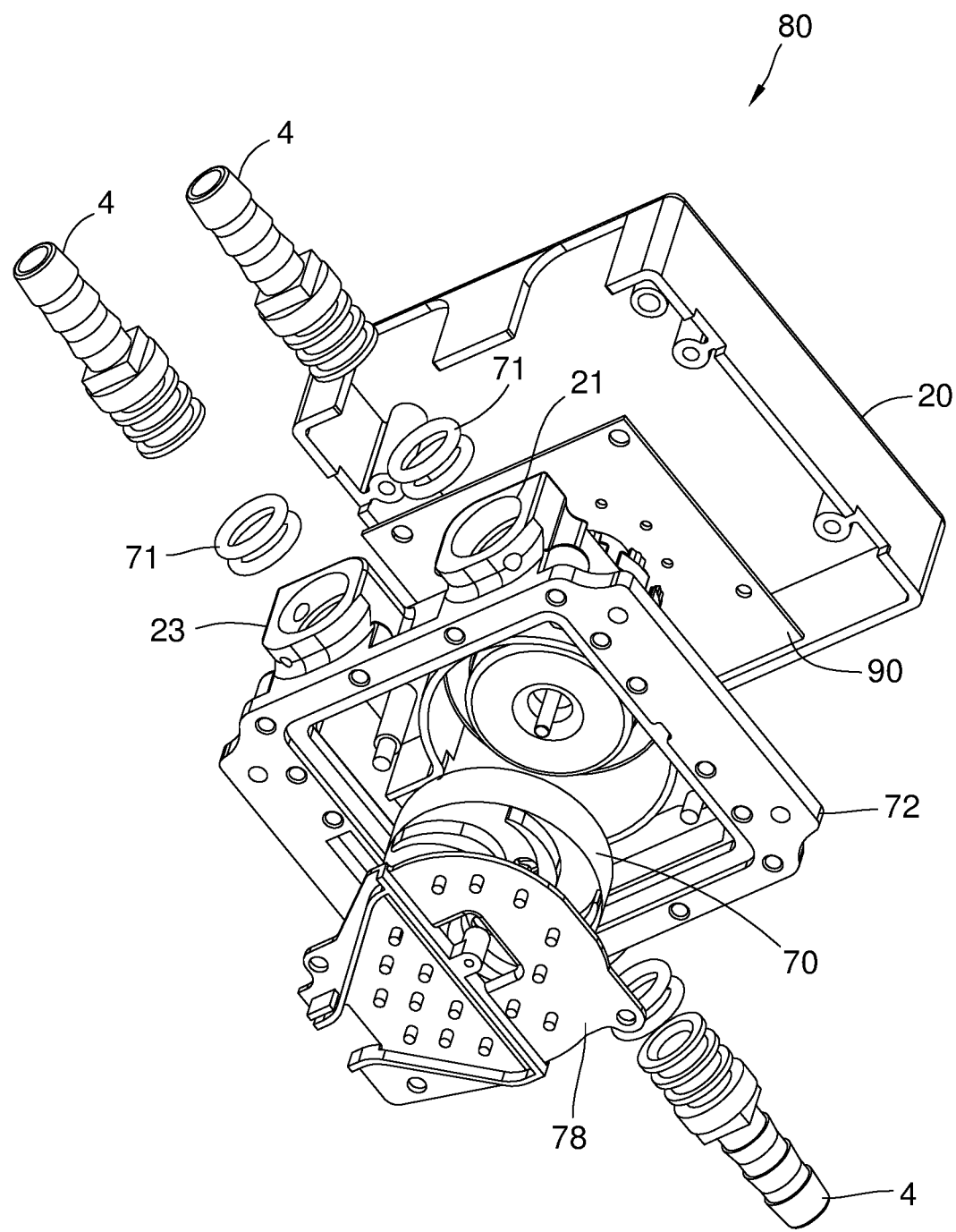
FIGS. 8-10 are exploded views of the liquid cooling heat sink structure of FIGS. 6 and 7A illustrating the bottom surfaces of the different components included in the liquid cooling heat sink structure.
Figure 9:
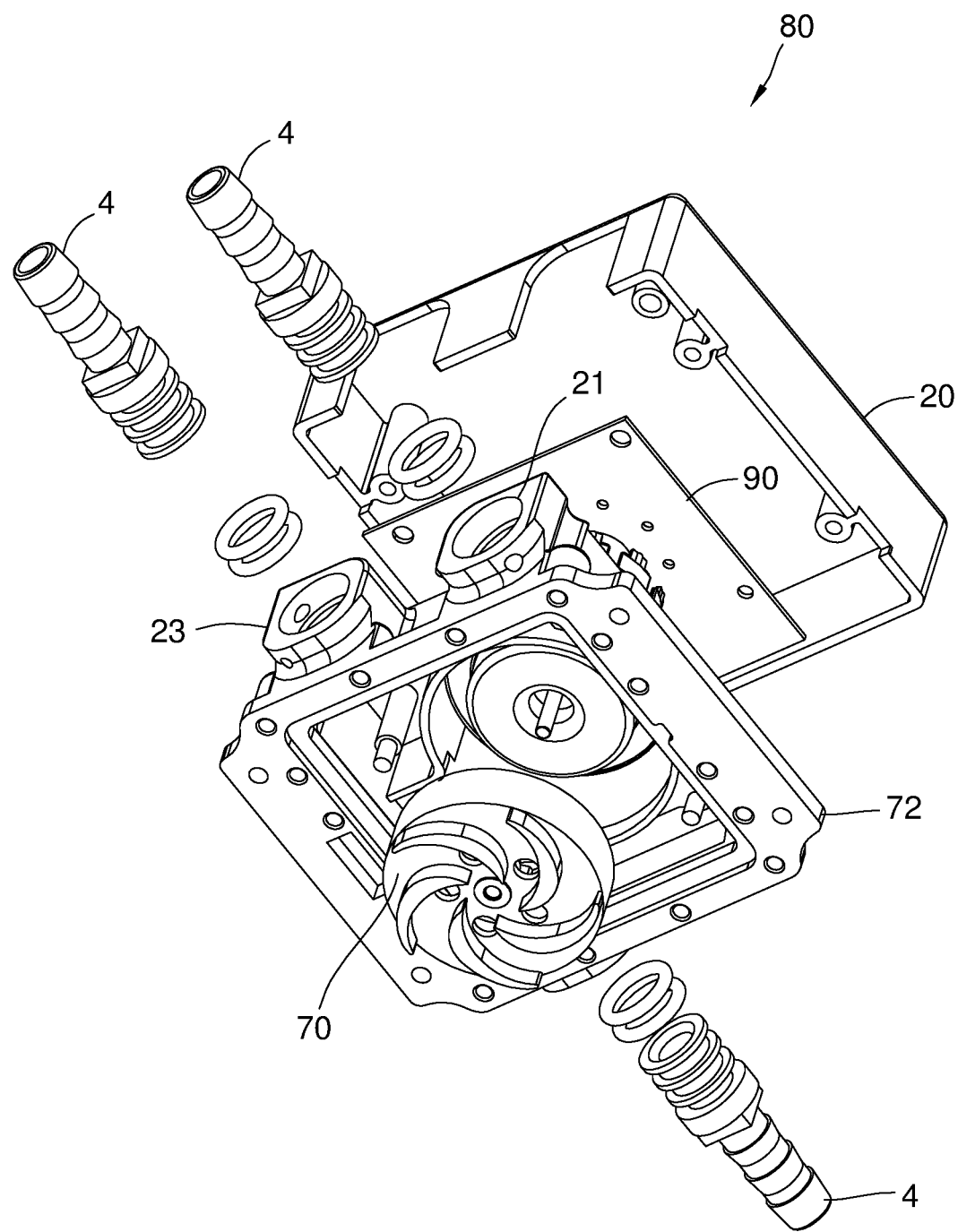
Figure 10:
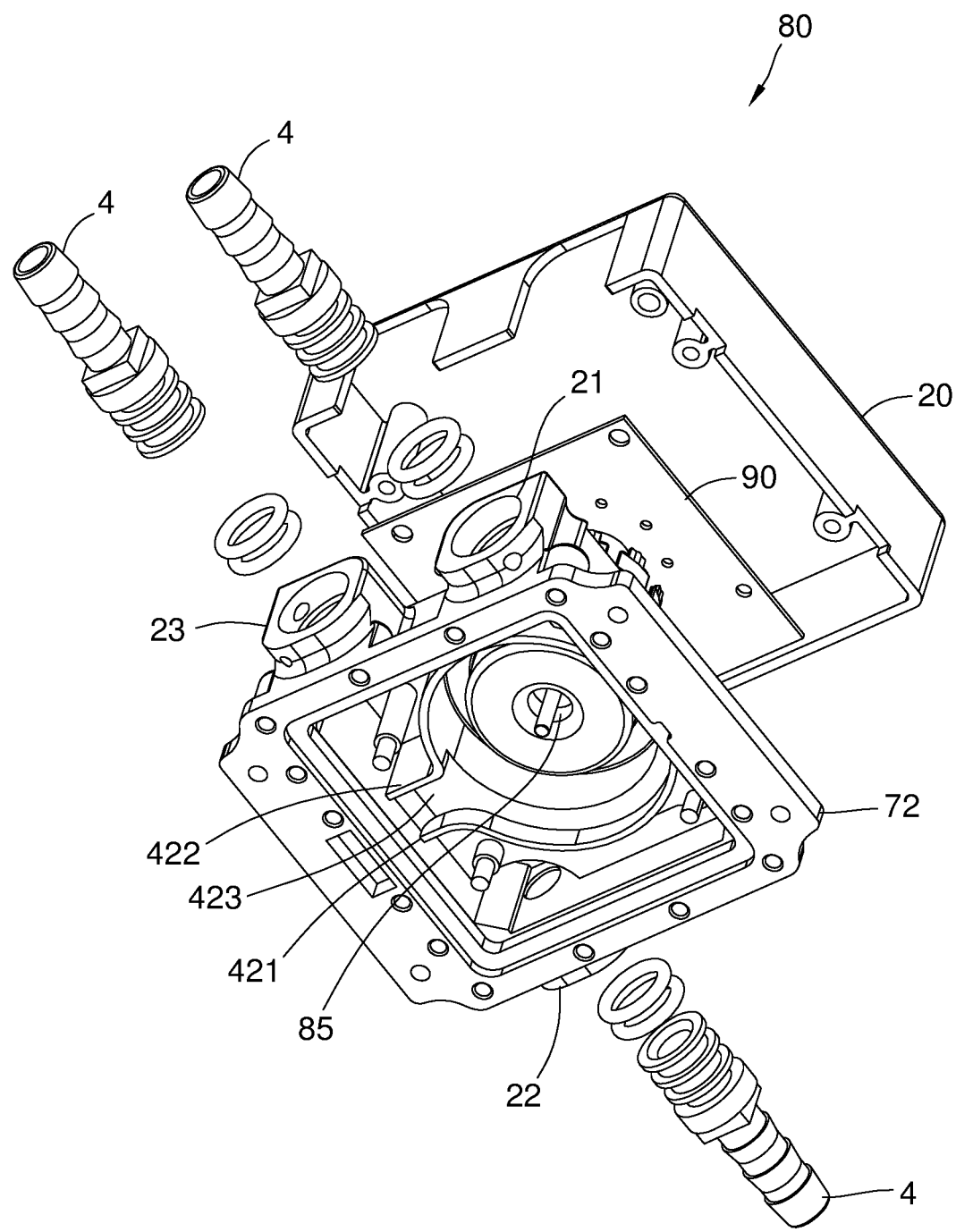

FIGS. 8-10 are exploded views of the liquid cooling heat sink structure 80 illustrating the bottom surfaces of the different components included in the liquid cooling heat sink structure 80. For the sake of clarity of illustration, in FIGS. 8-10, various components of the liquid cooling heat sink structure 80 are omitted for the sake of clarity of illustration.

The liquid cooling heat sink structure 80 can be used in the cooling circulation systems 400 and 500 in place of the liquid cooling heat sink structures 100. In such a configuration, cooling liquid is provided to both fluid inlets 21, 22 of the liquid cooling heat sink structure 80 for circulating the cooling liquid in the cooling circulation system 400. Thus, referring to FIG. 4, the inlets 21 of the liquid cooling heat sink structures 80 are not blocked by the plug member 3, and the pipeline 60 connects to the inlets 21 via pipe connectors 4. For instance, in order to provide cooling liquid to the inlet 21 of the liquid cooling heat sink structure 80 on the left, one end of a second pipeline (or tubing) is fluidly coupled to the segment of the pipeline 60 between the outlet of the exhaust 6 and the inlet 22, and the other end of the second pipeline is fluidly coupled to the inlet 21. Similarly, in order to provide cooling liquid to the inlet 21 of the liquid cooling heat sink structure 80 on the right, one end of a third pipeline (or tubing) is fluidly coupled to the segment of the pipeline 60 between the outlet 23 of the liquid cooling heat sink structure 80 on the left and the inlet 22 of the liquid cooling heat sink structure 80 on the right, and the other end of the second pipeline is fluidly coupled to the inlet 21. Thus, both inlets 21 and 22 of each liquid cooling heat sink structure 80 are utilized for circulating cooling liquid in the cooling circulation system 400.

Referring to FIG. 5, the inlets 22 of the liquid cooling heat sink structures 80 in the cooling circulation system 500 are not blocked by the plug member 3, and the pipeline 60 connects to the inlets 22 via pipe connectors 4. For instance, in order to provide cooling liquid to the inlet 22 of the liquid cooling heat sink structure 80 on the top, one end of a second pipeline (or tubing) is fluidly coupled to the segment of the pipeline 60 between the outlet of the exhaust 6 and the inlet 21, and the other end of the second pipeline is fluidly coupled to the inlet 22.

Similarly, in order to provide cooling liquid to the inlet 22 of the liquid cooling heat sink structure 80 on the bottom, the pipeline 60 is fluidly coupled to inlet 22. For instance, one end of a third pipeline (or tubing) is fluidly coupled to the segment of the pipeline 60 between the outlet of the exhaust 6 and the inlet 21, and the other end of the third pipeline is fluidly coupled to the inlet 22. Thus, both inlets 21 and 22 of each liquid cooling heat sink structure 80 are utilized for circulating cooling liquid in the cooling circulation system 500.

By utilizing both inlets 21 and 22 of each liquid cooling heat sink structure 80 for circulating cooling liquid in the cooling circulation systems 400 and 500, the amount of cooling liquid that is circulated in the cooling circulation systems 400 and 500 is increased, compared to the amount of cooling liquid circulated in the cooling circulation systems 400 and 500 when using the liquid cooling heat sink structure 100. Thus, the cooling capacity of the cooling circulation systems 400 and 500 is improved.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The invention illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

What is claimed is:

1. A liquid cooling heat sink structure, comprising:
   a thermal conduction module configured to dissipate heat and including a heat exchange unit;
   a cover coupled to the thermal conduction module and enclosing the heat exchange unit, the cover and the thermal conduction module defining a heat exchange chamber that includes the heat exchange unit, the cover defining a first opening and a second opening, and the cover being coupled to the thermal conduction module such that at least one of the first and second openings is above the heat exchange unit;
   a flow guidance plate disposed on the cover; and
   a housing disposed on the flow guidance plate and defining a first cavity and a second cavity fluidly isolated from each other, wherein the housing includes two fluid inlets each in fluid communication with the first cavity, and a fluid outlet in fluid communication with the second cavity.

2. The liquid cooling heat sink structure of claim 1, wherein
   the heat exchange unit includes a plurality of fins,
   the first opening is a first elongated slot and the second opening is a second elongated slot parallel to the first elongated slot, the first and second elongated slots having different lengths, and
   the cover is coupled to the thermal conduction module such that the first and second elongated slots extend perpendicular to the plurality of fins.

3. The liquid cooling heat sink structure of claim 1, wherein the flow guidance plate at least partially defines a first cavity and a second cavity separated from the first cavity, and defines a first plate opening in fluid communication with the second cavity and a second plate opening in fluid communication with the first cavity.

4. The liquid cooling heat sink structure of claim 3, wherein the first cavity of the flow guidance plate is in fluid communication with the heat exchange chamber via the first opening.

5. The liquid cooling heat sink structure of claim 4, wherein the flow guidance plate and the housing define a pumping chamber that is in fluid communication with the first cavity of the flow guidance plate via the second plate opening.

6. The liquid cooling heat sink structure of claim 5, wherein the pumping chamber is in fluid communication with second cavity of the flow guidance plate via the first plate opening.

7. The liquid cooling heat sink structure of claim 6, wherein the pumping chamber is further defined by at least two extension portions, the at least two extension portions forming a channel that is in fluid communication with the first cavity of the flow guidance plate via the second plate opening.

8. The liquid cooling heat sink structure of claim 6, wherein the housing further defines a third cavity which at least partially forms the pumping chamber and is sized to receive a rotor, and a fourth cavity sized to receive a stator.

9. The liquid cooling heat sink structure of claim 1, wherein the second cavity of the housing is in fluid communication with the heat exchange chamber via the second opening in the cover.

10. The liquid cooling heat sink structure of claim 3, wherein the first cavity of the housing is in fluid communication with the second cavity defined by the flow guidance plate.

11. The liquid cooling heat sink structure of claim 1, further comprising an outer casing secured to the thermal conduction module and enclosing the cover, the flow guidance plate, and the housing.

12. The liquid cooling heat sink structure of claim 1, further comprising a separating plate between the cover and the flow guidance plate, the separating plate including a thermally resistive material.

13. A cooling circulation system, comprising:
an exhaust; and
at least two liquid cooling heat sink structures according to claim 1, wherein
the at least two liquid cooling heat sink structures are fluidly coupled to each other in series via a pipeline fluidly coupled to both fluid inlets of each liquid cooling heat sink structure.

14. The cooling circulation system of claim 13, wherein the fluid inlet coupled to the pipeline and the fluid outlet are disposed on a same side of a respective liquid cooling heat sink structure.

15. A cooling circulation system, comprising:
an exhaust; and
at least two liquid cooling heat sink structures according to claim 1, wherein
the at least two liquid cooling heat sink structures fluidly coupled to each other in parallel via a pipeline fluidly coupled to both inlets of each liquid cooling heat sink structure.

16. The cooling circulation system of claim 15, wherein the fluid inlet coupled to the pipeline and the fluid outlet are disposed on a same side of a respective liquid cooling heat sink structure.

\* \* \* \* \*